United States Patent
Ishino et al.

(10) Patent No.: US 10,770,334 B2
(45) Date of Patent: Sep. 8, 2020

(54) SUBSTRATE HOLDING DEVICE

(71) Applicant: NGK SPARK PLUG CO., LTD., Nagoya-shi, Aichi (JP)

(72) Inventors: Tomohiro Ishino, Tomiya (JP); Shinya Kikuchi, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 218 days.

(21) Appl. No.: 15/600,867

(22) Filed: May 22, 2017

(65) Prior Publication Data
US 2017/0345701 A1    Nov. 30, 2017

(30) Foreign Application Priority Data
May 25, 2016 (JP) ................. 2016-104660

(51) Int. Cl.
H01L 21/683    (2006.01)
H01L 21/687    (2006.01)
H01L 21/67    (2006.01)
H01L 21/677    (2006.01)

(52) U.S. Cl.
CPC .... *H01L 21/6838* (2013.01); *H01L 21/67259* (2013.01); *H01L 21/67742* (2013.01); *H01L 21/67781* (2013.01); *H01L 21/6875* (2013.01); *H01L 21/68735* (2013.01)

(58) Field of Classification Search
CPC .......... H01L 21/6838; H01L 21/67259; H01L 21/67742; H01L 21/67781; H01L 21/68735; H01L 21/6875; B25B 11/00; B25B 11/02; B25B 11/005

USPC ......................... 269/21, 20, 289 R
See application file for complete search history.

(56) References Cited

U.S. PATENT DOCUMENTS

| | | | | |
|---|---|---|---|---|
| 5,088,006 A | * | 2/1992 | del Puerto | H01L 21/6838 257/714 |
| 5,155,652 A | * | 10/1992 | Logan | H01L 21/6831 279/128 |
| 5,324,012 A | * | 6/1994 | Aoyama | B25B 11/005 269/21 |
| 5,563,683 A | * | 10/1996 | Kamiya | G03F 7/707 355/53 |
| 5,730,803 A | * | 3/1998 | Steger | C23C 16/4586 118/723 E |

(Continued)

FOREIGN PATENT DOCUMENTS

JP    2008034723 A    *    2/2008
JP    4333065 B2        9/2009

OTHER PUBLICATIONS

JP-2008034723-A (Year: 2008).*

(Continued)

*Primary Examiner* — Lee D Wilson
*Assistant Examiner* — Thomas Raymond Rodgers
(74) *Attorney, Agent, or Firm* — Stites & Harbison, PLLC; Jeffrey A. Haeberlin; James R. Hayne

(57) ABSTRACT

A substrate holding device includes a base body that has a flat plate-like shape and in which gas holes that open in an upper surface of the base body are formed, and a plurality of protrusions that protrude upward from the upper surface of the base body. A groove that opens in a lower surface of the base body and that is connected to the gas holes is formed in the base body, and a plurality of protrusions that protrude downward are formed in the groove.

20 Claims, 2 Drawing Sheets

(56) References Cited

U.S. PATENT DOCUMENTS

| | | | | |
|---|---|---|---|---|
| 5,994,251 A * | 11/1999 | Niwa | C04B 35/111 | 501/127 |
| 6,073,681 A * | 6/2000 | Getchel | H01L 21/67103 | 118/728 |
| 6,108,190 A * | 8/2000 | Nagasaki | H01L 21/68757 | 361/234 |
| 6,164,633 A * | 12/2000 | Mulligan | B25B 11/005 | 269/21 |
| 6,257,564 B1 * | 7/2001 | Avneri | B25B 11/005 | 269/21 |
| 6,464,795 B1 * | 10/2002 | Sherstinsky | C23C 16/45521 | 118/715 |
| 6,468,098 B1 * | 10/2002 | Eldridge | G01R 1/0735 | 439/197 |
| 6,608,745 B2 * | 8/2003 | Tsuruta | H01L 21/6833 | 361/234 |
| 6,628,503 B2 * | 9/2003 | Sogard | G03F 7/707 | 257/E23.099 |
| 6,664,549 B2 * | 12/2003 | Kobayashi | B25B 11/005 | 250/440.11 |
| 6,722,642 B1 * | 4/2004 | Sutton | B25B 11/005 | 269/21 |
| 6,768,627 B1 * | 7/2004 | Kitabayashi | B23Q 3/15 | 361/234 |
| 6,802,761 B1 * | 10/2004 | Beaucage | B24D 18/00 | 451/28 |
| 6,885,541 B2 * | 4/2005 | Otsuka | H01G 2/065 | 257/E23.062 |
| 7,126,091 B1 * | 10/2006 | Westfall | H01L 21/6831 | 219/444.1 |
| 7,292,427 B1 * | 11/2007 | Murdoch | H01L 21/6838 | 361/234 |
| 7,396,236 B2 * | 7/2008 | Eldridge | G01R 1/07307 | 324/750.05 |
| 7,875,501 B2 * | 1/2011 | Tanaka | B24B 37/042 | 257/E21.235 |
| 8,525,418 B2 * | 9/2013 | Morita | H01L 21/6831 | 219/121.4 |
| 8,690,135 B2 * | 4/2014 | Vekstein | H01L 21/6875 | 269/21 |
| 8,691,666 B2 * | 4/2014 | Segawa | H01L 21/67092 | 257/E21.214 |
| D716,742 S * | 11/2014 | Jang | D13/182 | |
| 8,947,776 B2 * | 2/2015 | Terada | H01L 21/6838 | 359/391 |
| D724,553 S * | 3/2015 | Choi | D13/182 | |
| 9,017,060 B2 * | 4/2015 | Huang | B24B 53/017 | 425/388 |
| 9,136,031 B2 * | 9/2015 | Ito | H01L 21/6833 | |
| 9,177,846 B2 * | 11/2015 | Kawamura | C23C 16/4585 | |
| 9,222,192 B2 * | 12/2015 | Rauenbusch | C25D 17/001 | |
| 9,293,364 B2 * | 3/2016 | Kanda | H01L 21/76838 | |
| 9,347,988 B2 * | 5/2016 | Akiyama | G01R 31/2886 | |
| 9,793,152 B2 * | 10/2017 | Rudmann | H01L 21/6838 | |
| 2003/0160042 A1 * | 8/2003 | Hiramatsu | H01L 21/67103 | 219/444.1 |
| 2005/0152089 A1 * | 7/2005 | Matsuda | H02N 13/00 | 361/234 |
| 2006/0102849 A1 * | 5/2006 | Mertens | G03F 7/707 | 250/440.11 |
| 2007/0222131 A1 * | 9/2007 | Fukumoto | B25B 11/005 | 269/21 |
| 2008/0011737 A1 * | 1/2008 | Fukuoka | H01L 21/67103 | 219/444.1 |
| 2010/0156014 A1 * | 6/2010 | McClaran | B25B 11/005 | 269/21 |
| 2010/0194015 A1 | 8/2010 | Vekstein et al. | | |
| 2013/0270757 A1 * | 10/2013 | Thibaut | B23Q 1/03 | 269/21 |

OTHER PUBLICATIONS

Translation of JP-2008034723-A retrieved from Espacenet on Jun. 25, 2020 (Year: 2008).*

Taiwan Intellectual Property Office, Office Action issued in corresponding Application No. 106116816, dated Dec. 27, 2018. (English translation is not available.).

Korean Intellectual Property Office, Office Action (Notification of Reason for Refusal) issued in corresponding Application No. 10-2017-0062501, dated Oct. 21, 2019.

* cited by examiner

SUBSTRATE HOLDING DEVICE

CROSS REFERENCE TO RELATED APPLICATION

The present application claims priority to Japanese Patent Application No. 2016-104660, which was filed on May 25, 2016, the disclosure of which is herein incorporated by reference in its entirety.

BACKGROUND OF THE INVENTION

1. Field of the Invention

The present invention relates to a substrate holding device for holding a substrate, such as a semiconductor wafer, on a base body by suction.

2. Description of the Related Art

In semiconductor manufacturing systems and the like, a substrate holding device having the following structure has been used: the substrate holding device includes a base body and a large number of protrusions (pins) that are formed on an upper surface of the base body, for supporting a substrate, and on a lower surface of the base body, to be placed on a stage. The substrate holding device supports a substrate by using the protrusions (see, for example, PTL 1).

Another exiting substrate holding device includes a base body in which a groove, having an opening in a lower surface of the base body, is formed and in which a gas passage is formed by connecting a gas hole, having an opening in an upper surface of the base body, to the groove. The lower surface of the base body is supported by a stage, and the gas passage is connected to a vacuum sucking device.

PATENT LITERATURE

PTL 1 is Japanese Patent No. 4333065.

BRIEF SUMMARY OF THE INVENTION

However, this substrate holding device has a problem in that, because the base body is not supported by the stage at the groove, the base body and the substrate, which is supported by the base body, bends downward at a position above the groove.

An object of the present invention is to provide a substrate holding device that can reduce downward bending of a base body and a substrate, which is supported by the base body, at a position above a groove.

A substrate holding device according to the present invention includes a base body that has a flat plate-like shape and in which at least one gas hole that opens in an upper surface of the base body is formed, and a plurality of upper protrusions that protrude upward from the upper surface of the base body. A groove that opens in a lower surface of the base body and that is connected to the gas hole is formed in the base body, and a plurality of first lower protrusions that protrude downward are formed in the groove. (In other words, the base body defines a groove that opens on the lower surface and at least one gas hole extending from the upper surface to the groove.)

With the substrate holding device according to the present invention, the base body is supported by a stage not only at the lower surface of the base body but also at the first lower protrusions, which protrude downward from the groove. Thus, it is possible to reduce downward bending of the base body and the substrate at a position above the groove.

In the substrate holding device according to the present invention, preferably, a first loop-shaped lower protrusion that surrounds the groove in a loop shape and a second loop-shaped lower protrusion that surrounds the first loop-shaped lower protrusion in a loop shape are formed on the lower surface of the base body so as to protrude downward, and a second lower protrusion that protrudes downward from the lower surface of the base body is formed between the first loop-shaped lower protrusion and the second loop-shaped lower protrusion.

In this case, the base body is supported by the stage not only at the lower end surfaces of the two loop-shaped protrusions and the lower end surface of the second lower protrusion but also at the first lower protrusions, which protrude downward from the groove. Thus, it is possible to reduce downward bending of the base body and the substrate at a position above the groove.

In the substrate holding device according to the present invention, preferably, lower end surfaces of the first lower protrusions and a lower end surface of the second lower protrusion are located on substantially the same plane, and a lower end surface of the first loop-shaped lower protrusion and a lower end surface of the second loop-shaped lower protrusion are located lower than the lower end surfaces of the first and second lower protrusions by 1 µm or more and 5 µm or less (i.e., between 1 µm and 5 µm).

In this case, the contact area between the protrusions and the stage, on which the base body is placed, is reduced, and the probability that the profile irregularity increases due to particles can be reduced.

The meaning of the phrase "the lower end surfaces of the first lower protrusions and the lower end surface of the second lower protrusion are located substantially on the same plane" is not limited to the meaning that the lower end surfaces are exactly on the same plane. The meaning also includes a case where the lower end surfaces are located substantially on the same plane, as long as the substrate, which is supported on the upper surface of the base body, can have a flatness that is needed when various processing steps are performed on the substrate.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A. First Embodiment

Figure 1:
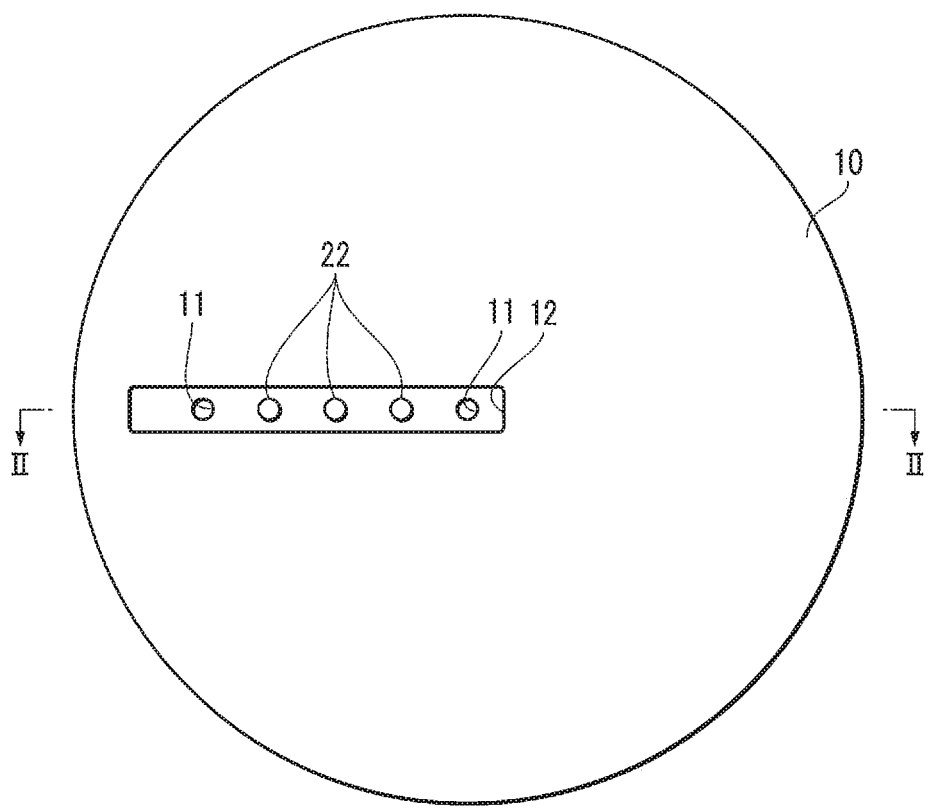
FIG. 1 is a schematic bottom view of a base body of a substrate holding device according to a first embodiment of the present invention.
Figure 2:
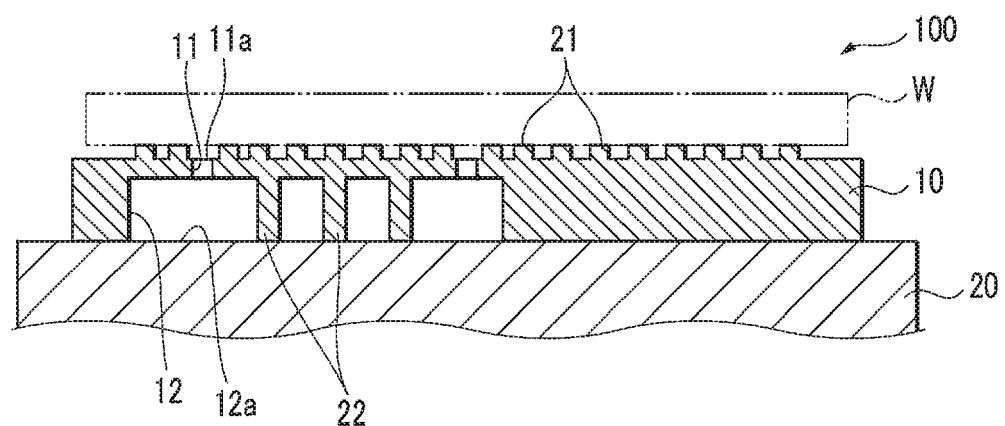
FIG. 2 is a schematic sectional view of the substrate holding device taken along line II-II of FIG. 1.

Referring to FIGS. 1 and 2, a substrate holding device 100 according to a first embodiment of the present invention will be described.

The substrate holding device 100 includes a base body 10, having a substantially flat plate-like shape, for holding a substrate (wafer) W by suction. The base body 10 is made from a ceramic sintered compact so as to have the substantially flat plate-like shape. Instead of the substantially disk-like shape, the base body 10 may have any appropriate shape, such as a polygonal plate-like shape or an elliptical plate-like shape.

Gas holes 11 that open in an upper surface (surface) of the base body 10 are formed in the base body 10. The gas holes 11 are connected to a groove 12 that opens in a lower surface of the base body 10. The gas holes 11 and the groove 12 may be connected to each other via a gas passage extending through the inside of the base body 10. The groove 12 is connected to a vacuum sucking device (not shown) via a stage.

The cross sectional area of the groove 12 is determined in accordance with a pressure loss that occurs when sucking gas from the inside of the groove 12. The depth of the groove 12 is 0.1 mm or more and 0.4 mm or less, more preferably 0.2 mm or more and 0.3 mm or less. For example, the depth is 0.2 mm. The width of the gas holes 11 is 0.5 mm or more and 3.0 mm or less. For example, the width is 0.8 mm.

In the present embodiment, a plurality of (in FIG. 1, two) openings 11a of the gas holes 11 are present in the upper surface of the base body 10. One of the openings 11a is located at the center of the upper surface of the base body 10. However, the number and the arrangement of the openings 11a are not limited to these. None of the openings 11a may be located at the center of the base body 10.

A plurality of protrusions 21 protrude upward from the upper surface of the base body 10. The protrusions 21 correspond to upper protrusions in the present invention. The substrate W is supported on top surfaces of the protrusions 21. The arrangement, the shape, the height, and the like of the protrusions 21 are not particularly limited and may be the same as or similar to those of protrusions formed on an upper surface of a base body of existing substrate supporting devices. A loop-shaped protrusion, which surrounds the protrusions 21, protrudes upward from the upper surface of the base body 10.

An opening 12a of the groove 12 is present in the lower surface of the base body 10. In FIG. 1, the opening 12a of the groove 12 has a substantially rectangular shape that has rounded corners and that extends linearly from the center of the lower surface toward the outer peripheral surface of the base body 10. The groove 12 is recessed upward with the same shape as the opening 12a. The entirety of the groove 12 has a substantially rectangular-parallelepiped shape with rounded corners.

The groove 12 is connected to the gas holes 11, which have the openings 11a in the upper surface of the base body 10. The entirety of each of the gas holes 11 has a hollow cylindrical shape. Thus, the openings 11a in the upper surface of the base body 10 and the opening 12a in the lower surface of the base body 10 are connected to each other.

At least one protrusion 22 is formed on the bottom surface of the groove 12 so as to protrude downward. The protrusion 22 corresponds to a first lower protrusion in the present invention. The height of the protrusion 22 is substantially the same as the depth of the groove 12.

The protrusion 22 may have a solid cylindrical shape, a pyramidal shape, a conical frustum shape, or the like. The protrusion 22 may have a conical frustum shape having a large base angle of about 45 degrees. Therefore, the protrusion 22 can be formed by abrasive blasting.

However, since the protrusion 22 is formed in the groove 12, preferably, the protrusion 22 has an appropriate shape such that the protrusion 22 does not hinder sucking of gas from the inside of the groove 12. Therefore, preferably, the protrusion 22 has a sharp conical frustum shape with a high aspect ratio having a base angle of 70° or more and 85° or less, and more preferably 75° or more and 80° or less. The protrusion 22 can be formed by laser processing. However, the shape of the protrusion 22 is not limited to a conical frustum shape and may be a solid cylindrical shape or a pyramidal shape.

The lower surface of the base body 10 is supported by the upper surface of a stage 20. To be specific, the lower surface of the base body 10 and lower end surface of the protrusion 22 are in contact with the upper surface of the stage 20.

Thus, the base body 10 is supported by the stage 20 not only at the lower surface of the base body 10 but also at the protrusion 22, which protrudes downward from the bottom surface of the groove 12. Thus, it is possible to reduce downward bending of the base body 10 and the substrate W at a position above the groove 12.

B. Second Embodiment

Figure 3:
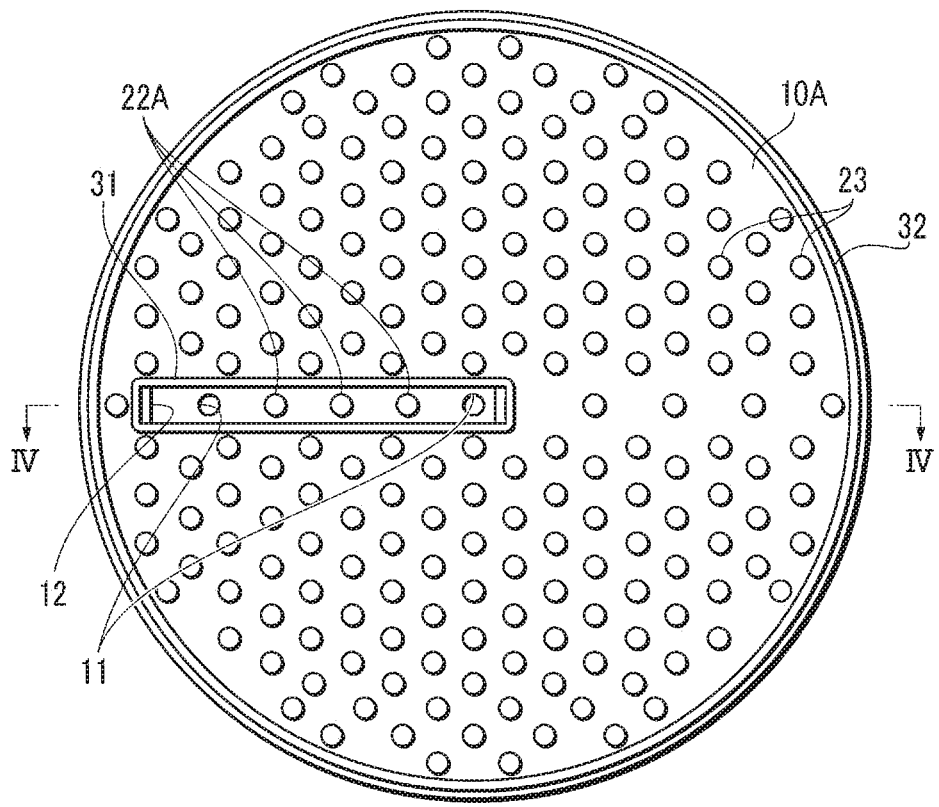
FIG. 3 is a schematic bottom view of a base body of a substrate holding device according to a second embodiment of the present invention.
Figure 4:
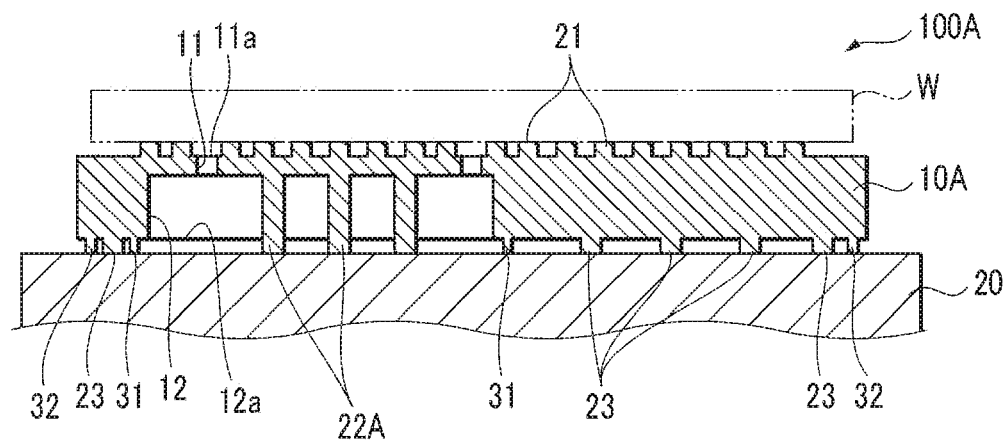
FIG. 4 is a schematic sectional view of the substrate holding device taken along line IV-IV of FIG. 3.

Referring to FIGS. 3 and 4, a substrate holding device 100A according to a second embodiment of the present invention will be described. Because the substrate holding device 100A is similar to the substrate holding device 100 described above, only the differences will be described.

A loop-shaped protrusion 31 protrudes downward from the lower surface of a base body 10A so as to surround the outer periphery of the groove 12. In FIG. 3, the loop-shaped protrusion 31 is shaped like a continuous loop that surrounds the opening 12a of the groove 12 and that has a substantially rectangular shape with rounded corners as seen from below. The loop-shaped protrusion 31 corresponds to a first loop-shaped lower protrusion in the present invention.

Moreover, a loop-shaped protrusion 32 protrudes downward from the lower surface of the base body 10A so as to surround the outer periphery of the loop-shaped protrusion 31. Here, the loop-shaped protrusion 32 is shaped like a continuous loop that is located slightly closer to the center than the outer periphery of the base body 10A as seen from below. The loop-shaped protrusion 32 corresponds to a second loop-shaped lower protrusion in the present invention.

A plurality of protrusions 23 protrude downward from a region of the lower surface of the base body 10A between the loop-shaped protrusion 31 and the loop-shaped protrusion 32. The protrusions 23 each correspond to a second lower protrusion in the present invention. The loop-shaped protrusion 31, the loop-shaped protrusion 32, and the protrusions 23 have the same height, which is 0.1 mm or more and 1.0 mm or less. For example, the height is 0.15 mm.

Thus, the lower end surfaces of the loop-shaped protrusions 31 and 32 and the protrusions 23 are flush with each other. Therefore, it is possible to reduce the area of surfaces to be polished and to reduce the time required for polishing the surfaces, compared with the first embodiment, in which it is necessary to make the most parts of the lower surface of the base body 10 flush with each other.

The protrusions 23 may have a solid cylindrical shape, a pyramidal shape, a conical frustum shape, or the like. The protrusions 23 may have a conical frustum shape having a large base angle of, for example, 45 degrees. Therefore, the protrusions 23 can be formed by abrasive blasting. However, the protrusions 23 may have a sharp conical frustum shape having a high aspect ratio.

At least one protrusion 22A protrudes downward from the bottom surface of the groove 12. The protrusion 22A corresponds to a first lower protrusion in the present invention. The height of the protrusion 22A is the same as or substantially the same as the sum of the depth of the groove 12 and the heights of the loop-shaped protrusions 31 and 32 and the protrusions 23.

As a modification of the second embodiment, the lower end surfaces of the protrusions 22A and 23 may be located on substantially the same plane and the lower end surfaces of the loop-shaped protrusion 31 and the loop-shaped protrusion 32 may be located lower than the lower end surfaces of the protrusions 22A and 23 by 1 µm or more and 5 µm or less. This structure is preferable, because the contact area between the protrusions and the stage is reduced and the probability of an increase of the profile irregularity due to particles can be reduced.

The protrusion 22A may have a solid cylindrical shape, a pyramidal shape, a conical frustum shape, or the like. However, preferably, the shape is a sharp conical frustum having a high aspect ratio, since the protrusion 22A is formed in the groove 12.

Thus, the base body 10A is supported by the stage 20 not only at the lower end surfaces of the two loop-shaped protrusions 31 and 32 and the lower end surfaces of the protrusions 23 but also at the protrusion 22A, which protrudes downward from the bottom surface of the groove 12. Thus, it is possible to reduce downward bending of the base body 10A and the substrate W at a position above the groove 12.

In the figures, in order to clearly illustrate the structures of the substrate holding devices 100 and 100A, the shapes of the gas holes 11, the groove 12, the protrusion 21, 22, 22A, and 23, the loop-shaped protrusions 31 and 32, and the stage 20 are appropriately modified. The aspect ratios of components shown in the sectional views and the ratios between the width, the height, and the distance between the components shown in the figures differ from those of actual ones.

Although not illustrated, a lift-pin hole, a rib, or the like may be formed in/on the base body 10. The shapes of the groove 12 and the opening 12a are not limited to those described above. For example, the shape of the opening 12a of the groove 12 is not limited to a substantially rectangular shape and may be any appropriate shape, such as a polygonal shape, a circular shape, or an elliptical shape.

What is claimed is:

1. A substrate holding device comprising:
a base body having a flat plate-like shape and including:
an upper surface;
a lower surface; and
a plurality of upper protrusions protruding upward from the upper surface;
the base body defining:
an elongated groove that opens on the lower surface with a bottom surface of the groove positioned a depth away from the lower surface of the base body; and
at least one gas hole extending from the upper surface to the bottom surface of the elongated groove;
the base body further including a plurality of first lower protrusions protruding downward from the bottom surface of the elongated groove.

2. The substrate holding device according to claim 1,
wherein a first loop-shaped lower protrusion that surrounds the elongated groove in a loop shape and a second loop-shaped lower protrusion that surrounds the first loop-shaped lower protrusion in a loop shape are formed on the lower surface of the base body so as to protrude downward, and
wherein a second lower protrusion that protrudes downward from the lower surface of the base body is formed between the first loop-shaped lower protrusion and the second loop-shaped lower protrusion.

3. The substrate holding device according to claim 2,
wherein lower end surfaces of the first lower protrusions and a lower end surface of the second lower protrusion are located on substantially the same plane, and
wherein a lower end surface of the first loop-shaped lower protrusion and a lower end surface of the second loop-shaped lower protrusion are located lower than the lower end surfaces of the first and second lower protrusions by between 1 µm and 5 µm.

4. The substrate holding device according to claim 1, wherein each of the first lower protrusions has a frustum shape with a base angle of 70° or more and 85° or less.

5. The substrate holding device according to claim 4, wherein each of the first lower protrusions has a conical frustum shape.

6. The substrate holding device according to claim 1, wherein the base body defines at least two gas holes extending from the upper surface to the elongated groove and each of the plurality of first lower protrusions is aligned between two of the at least two gas holes.

7. The substrate holding device according to claim 2, wherein the first loop-shaped lower protrusion is positioned adjacent to the elongated groove and the second loop-shaped lower protrusion is positioned adjacent to an outer periphery of the base body.

8. The substrate holding device according to claim 1, wherein the elongated groove is located on only one side of the lower surface.

9. The substrate holding device according to claim 1, wherein no gas holes extend through the base body outside of the elongated groove.

10. The substrate holding device according to claim 2, wherein no gas holes are defined between the first loop-shaped lower protrusion and the second loop-shaped lower protrusion.

11. A substrate holding device comprising:
a base body having a flat plate-like shape and including:
an upper surface;
a lower surface; and
a plurality of upper protrusions protruding upward from the upper surface; the base body defining:
an elongated groove that opens on the lower surface with a bottom surface of the elongated groove positioned a depth away from the lower surface of the base body, the elongated groove extending radially from a center of the base body in one direction; and
one or more gas holes extending through the base body from the upper surface of the base body to the bottom surface of the elongated groove with each of the gas holes located within the elongated groove; the base body further including a plurality of first lower protrusions protruding downward in-from the bottom surface of the elongated groove.

12. The substrate holding device according to claim 11,
wherein a first loop-shaped lower protrusion that surrounds the elongated groove in a loop shape and a second loop-shaped lower protrusion that surrounds the first loop-shaped lower protrusion in a loop shape are formed on the lower surface of the base body so as to protrude downward, and wherein a second lower protrusion that protrudes downward from the lower surface of the base body is formed between the first loop-shaped lower protrusion and the second loop-shaped lower protrusion.

13. The substrate holding device according to claim 12, wherein lower end surfaces of the first lower protrusions and a lower end surface of the second lower protrusion are located on substantially the same plane, and wherein a lower end surface of the first loop-shaped lower protrusion and a lower end surface of the second loop-shaped lower protrusion are located lower than the lower end surfaces of the first and second lower protrusions by between 1 µm and 5 µm.

14. The substrate holding device according to claim 11, wherein each of the first lower protrusions has a frustum shape with a base angle of 70° or more and 85° or less.

15. The substrate holding device according to claim 14, wherein each of the first lower protrusions has a conical frustum shape.

16. The substrate holding device according to claim 11, wherein the base body defines at least two gas holes extending from the upper surface to the elongated groove and each of the plurality of first lower protrusions is aligned between two of the at least two gas holes.

17. The substrate holding device according to claim 12, wherein the first loop-shaped lower protrusion is positioned adjacent to the elongated groove and the second loop-shaped lower protrusion is positioned adjacent to an outer periphery of the base body.

18. A substrate holding device comprising: a base body having a flat plate-like shape and including: an upper surface; a lower surface; and a plurality of upper protrusions protruding upward from the upper surface; the base body defining: an elongated groove that opens on the lower surface; and at least one gas hole extending from the upper surface to the elongated groove; the base body further including a plurality of first lower protrusions protruding downward in the elongated groove, each of the first lower protrusions having a frustum shape with a base angle of 700 or more and 85' or less.

19. The substrate holding device according to claim 18, wherein a first loop-shaped lower protrusion that surrounds the elongated groove in a loop shape and a second loop-shaped lower protrusion that surrounds the first loop-shaped lower protrusion in a loop shape are formed on the lower surface of the base body so as to protrude downward, and wherein a plurality of second lower protrusions that protrude downward from the lower surface of the base body are formed between the first loop-shaped lower protrusion and the second loop-shaped lower protrusion, each of the second lower protrusions having a frustum shape with a base angle less than the base angle of each of the first lower protrusions.

20. The substrate holding device according to claim 19, wherein lower end surfaces of the first lower protrusions and a lower end surface of the second lower protrusion are located on substantially the same plane, and wherein a lower end surface of the first loop-shaped lower protrusion and a lower end surface of the second loop-shaped lower protrusion are located lower than the lower end surfaces of the first and second lower protrusions by between 1 µm and 5 µm.

\* \* \* \* \*